(12) United States Patent
Matsusue

(10) Patent No.: US 9,054,484 B2
(45) Date of Patent: Jun. 9, 2015

(54) PACKAGED OPTICAL SEMICONDUCTOR DEVICE

(75) Inventor: Akihiro Matsusue, Nagasaki (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/373,662

(22) PCT Filed: Apr. 4, 2012

(86) PCT No.: PCT/JP2012/059190
§ 371 (c)(1),
(2), (4) Date: Jul. 22, 2014

(87) PCT Pub. No.: WO2013/150616
PCT Pub. Date: Oct. 10, 2013

(65) Prior Publication Data
US 2015/0008552 A1    Jan. 8, 2015

(51) Int. Cl.
| | |
|---|---|
| H01S 5/026 | (2006.01) |
| H01S 5/042 | (2006.01) |
| H01L 31/12 | (2006.01) |
| H01S 5/022 | (2006.01) |
| H01S 5/062 | (2006.01) |

(52) U.S. Cl.
CPC .......... *H01S 5/0262* (2013.01); *H01S 5/02212* (2013.01); *H01S 5/02236* (2013.01); *H01S 5/02248* (2013.01); *H01S 5/02276* (2013.01); *H01S 5/0427* (2013.01); *H01S 5/06226* (2013.01); *H01L 2224/48137* (2013.01); *H01L 2224/48091* (2013.01); *H01L 31/12* (2013.01)

(58) Field of Classification Search
CPC .............................. H01S 5/0262; H01L 31/12
USPC ............................................. 257/431; 372/36
See application file for complete search history.

(56) References Cited

U.S. PATENT DOCUMENTS

| | | | |
|---|---|---|---|
| 2004/0208211 A1* | 10/2004 | Maruyama et al. | 372/38.1 |
| 2004/0247004 A1* | 12/2004 | Keh et al. | 372/36 |
| 2005/0185882 A1* | 8/2005 | Zack et al. | 385/15 |
| 2008/0237768 A1* | 10/2008 | Yajima et al. | 257/434 |
| 2008/0267234 A1* | 10/2008 | Scofet et al. | 372/36 |

(Continued)

FOREIGN PATENT DOCUMENTS

| | | |
|---|---|---|
| JP | 1-108751 A | 4/1989 |
| JP | 2001-156380 A | 6/2001 |

(Continued)

OTHER PUBLICATIONS

English translation of Written Opinion for PCT/JP2012/059190 (Oct. 14, 2014).

(Continued)

*Primary Examiner* — Peter Bradford
(74) *Attorney, Agent, or Firm* — Leydig, Voit & Mayer, Ltd.

(57) ABSTRACT

A wiring is located on a multilayer ceramic substrate. A ceramic block is located on the multilayer ceramic substrate. Electronic parts, including a semiconductor laser, are located on a surface of the ceramic block. A wiring located on the surface of the ceramic block connects some of the electronic parts to the wiring. A metallic cap with a glass window is located on the multilayer ceramic substrate. This metallic cap covers the ceramic block and the electronic parts, including the semiconductor laser.

10 Claims, 14 Drawing Sheets

(56) References Cited

U.S. PATENT DOCUMENTS

| | | | |
|---|---|---|---|
| 2010/0128750 A1* | 5/2010 | Fukuda et al. | 372/50.121 |
| 2011/0317965 A1 | 12/2011 | Fujimura et al. | |
| 2012/0267738 A1* | 10/2012 | Kuwahara et al. | 257/431 |

FOREIGN PATENT DOCUMENTS

| | | |
|---|---|---|
| JP | 2003-163382 A | 6/2003 |
| JP | 2004-221095 A | 5/2004 |
| JP | 2004-363550 A | 12/2004 |
| JP | 2007-43073 A | 2/2007 |
| JP | 2009-289841 A | 12/2009 |
| JP | 2010-129833 A | 6/2010 |
| JP | 2011-99911 A | 5/2011 |
| JP | 2011-108939 A | 6/2011 |
| JP | 2011-155091 A | 8/2011 |

OTHER PUBLICATIONS

Taiwan Patent Office; Office Action in corresponding Taiwanese Patent Application No. 101117718 dated May 29, 2014.

Search Report PCT/JP2012/059190 dated May 1, 2012.

Japanese Patent Office; Office Action in Japanese Patent Application No. 2014-508956 (Mar. 24, 2015).

* cited by examiner

PACKAGED OPTICAL SEMICONDUCTOR DEVICE

TECHNICAL FIELD

The present invention relates to a semiconductor package for optical communication.

BACKGROUND ART

Conventional semiconductor packages for optical communication include metal packages and CAN packages. A metal package is a combination of a multilayer ceramic substrate and a metallic box. A CAN package has a metal plate, a metallic rod passed through an open hole in the metal plate and hermetically sealed and insulated with glass, and a welded cap with a window.

The metal package has an excellent high-frequency characteristic because of use of the multilayer ceramic substrate. The metal package, however, has a complicated structure and a large number of parts and is high in cost. Also, because of its box form, parts can be mounted only from the opening side (upper side) before the package is closed.

In the case of the CAN package, parts can be mounted from all directions onto the upper surface of the metal plate, and the metal plate and the cap can be joined to each other in an instant by electric welding. The CAN package therefore has high producibility. However, since the lead for supplying a signal is fixed by glass sealing on the metal plate, it is difficult to achieve impedance matching thereat and the CAN package is inferior in high-frequency characteristic.

A semiconductor package has been proposed which has an optical semiconductor element mounted in a recess in an upper surface of a multilayer ceramic substrate and covered with a metallic cap with a window (see, for example, Patent Literature 1).

CITATION LIST

Patent Literature

Patent Literature 1: Japanese Patent Laid-Open No. 2003-163382

SUMMARY OF INVENTION

Technical Problem

In the conventional semiconductor package, the optical semiconductor element can be mounted only on the bottom surface of the recess in the upper surface of the multilayer ceramic substrate and the degree of design freedom is low. Also, only a surface-emitting or surface-receiving type of optical semiconductor element can be used. Moreover, the space for mounting electronic parts on the multilayer ceramic substrate in the metallic cap is restricted.

The present invention has been achieved to solve the above-described problem, and an object of the present invention is to obtain a semiconductor package improved in high-frequency characteristic, producibility, mount space and degree of design freedom.

Means for Solving the Problems

A semiconductor package according to the present invention includes: a multilayer ceramic substrate including a first wiring; a block on the multilayer ceramic substrate; a plurality of electronic parts on a surface of the block and including an optical semiconductor element; a second wiring on the surface of the block and connecting a part of the plurality of electronic parts to the first wiring; and a metallic cap with a window on the multilayer ceramic substrate and covering the block and the plurality of electronic parts.

Effect of Invention

The present invention makes it possible to obtain a semiconductor package improved in high-frequency characteristic, producibility, mount space and degree of design freedom.

DESCRIPTION OF EMBODIMENTS

A semiconductor package according to the embodiments of the present invention will be described with reference to the drawings. The same components will be denoted by the same symbols, and the repeated description thereof may be omitted.

Embodiment 1

Figure 1:
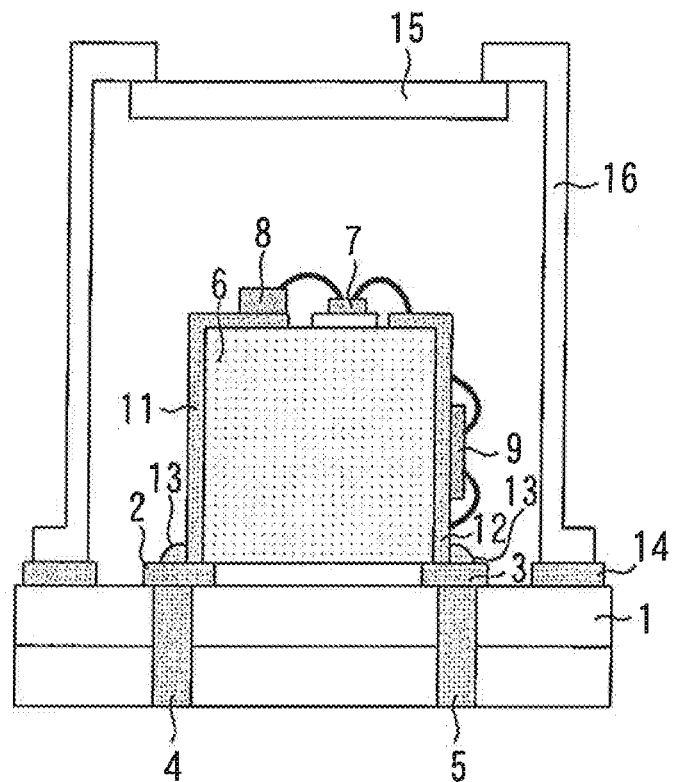
FIG. 1 is a sectional view showing a semiconductor package according to Embodiment 1 of the present invention.
Figure 2:
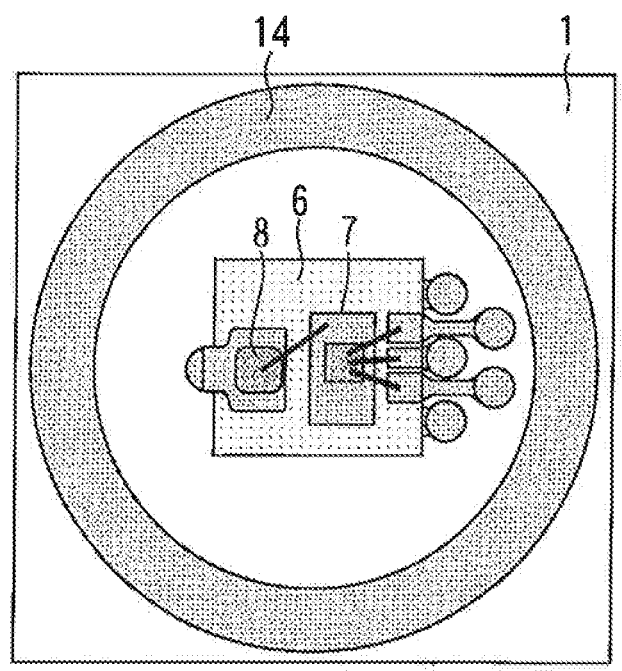
FIG. 2 is a top view showing parts inside a cap of the semiconductor package according to Embodiment 1 of the present invention.
Figure 3:
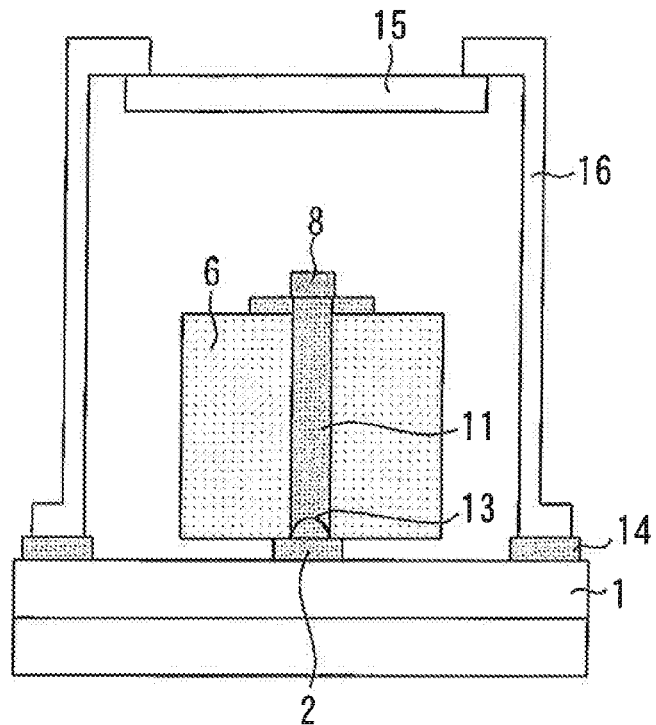
FIGS. 3 and 4 are sectional views showing the parts inside the cap of the semiconductor package according to Embodiment 1 of the present invention.
Figure 4:
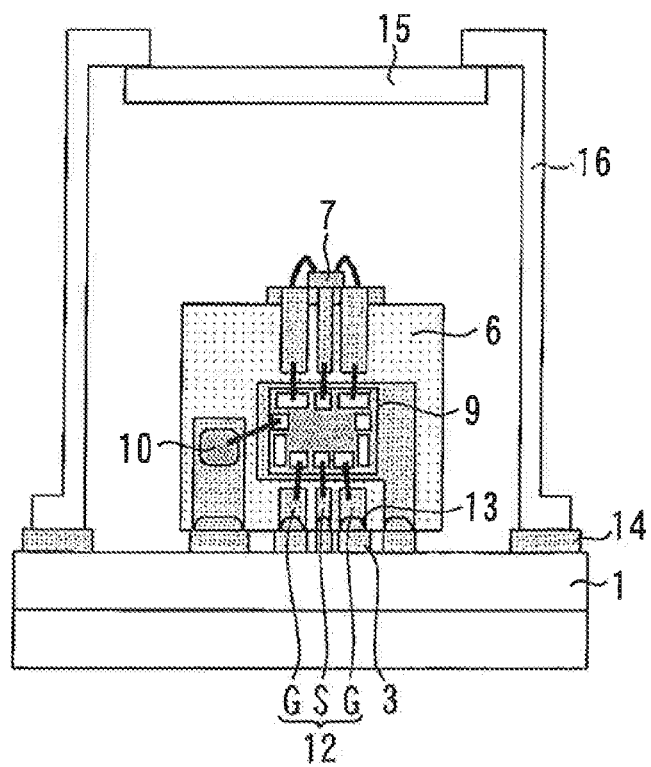

FIG. 1 is a sectional view showing a semiconductor package according to Embodiment 1 of the present invention. FIG. 2 is a top view showing parts inside a cap of the semiconductor package according to Embodiment 1 of the present invention. FIGS. 3 and 4 are sectional views showing the parts inside the cap of the semiconductor package according to Embodiment 1 of the present invention.

Wirings 2 and 3 are provided on an upper surface of a multilayer ceramic substrate 1. The wirings 2 and 3 are respectively connected to vias 4 and 5 formed through the multilayer ceramic substrate 1.

A ceramic block 6 is provided on the multilayer ceramic substrate 1. A surface-emitting type of semiconductor laser 7 and a capacitor 8 are provided on an upper surface of the ceramic block 6. A surface-receiving type of light receiving element may be used in place of the surface-emitting type of semiconductor laser 7.

A drive circuit 9 (transimpedance amplifier (TIA)) for driving the semiconductor laser 7 and a capacitor 10 are provided on a side surface of the ceramic block 6. The semiconductor laser 7 and the capacitor 8 are connected to each other by a wire; the semiconductor laser 7 and the drive circuit 9 are connected to each other by wires and wiring; and the drive circuit 9 and the capacitor 10 are connected to each other by a wire.

Wirings 11 and 12 are provided on surfaces of the ceramic block 6. The wiring 11 connects the capacitor 8 and the wiring 2 on the multilayer ceramic substrate 1 to each other. The wiring 12 connects the drive circuit 9 with the wiring 3 on the multilayer ceramic substrate 1. The wiring 12 is a coplanar line having signal wiring S interposed between pieces of ground wiring G.

The ceramic block 6 is placed on the multilayer ceramic substrate 1 so that the wirings 2 and 3 overlap the wirings 11 and 12. Overlap portions of the wirings 2 and 3 and overlap portions of the wirings 11 and 12 are joined to each other by an electrically conductive joint material 13 such as solder or an electrically conductive resin applied to corner portions. Because of this nonuse of wire bonding, a high-frequency transmission loss at the joints between the wirings 2 and 3 and the wirings 11 and 12 can be reduced to improve a high-frequency characteristic. Since the need for a wire bonding step can be eliminated, the producibility can be improved.

A metallic ring 14 is provided on the multilayer ceramic substrate 1. A metallic cap 16 with a glass window 15 is electrically welded to the metallic ring 14. The metallic cap 16 covers the ceramic block 6 and a plurality of electronic parts including the semiconductor laser 7.

Figure 5:
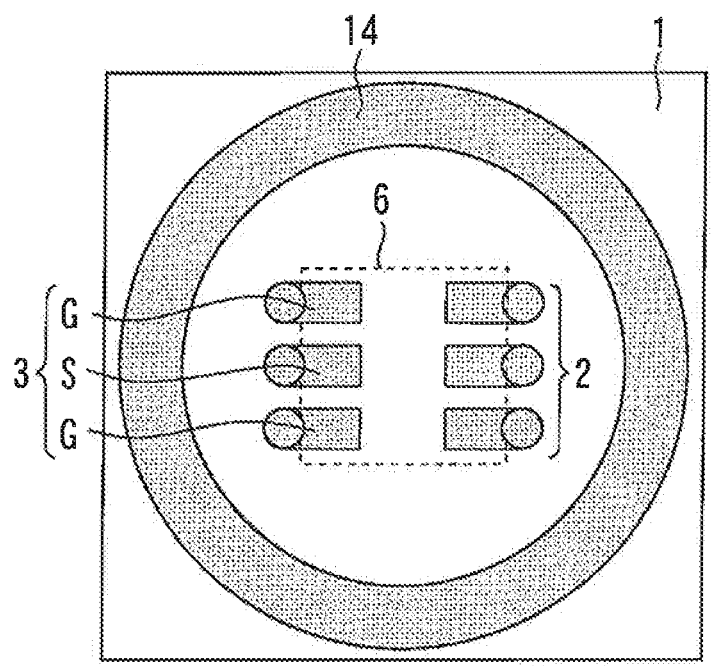
FIGS. 5 to 10 are top views showing examples of the multilayer ceramic substrate according to Embodiment 1 of the present invention.
Figure 6:
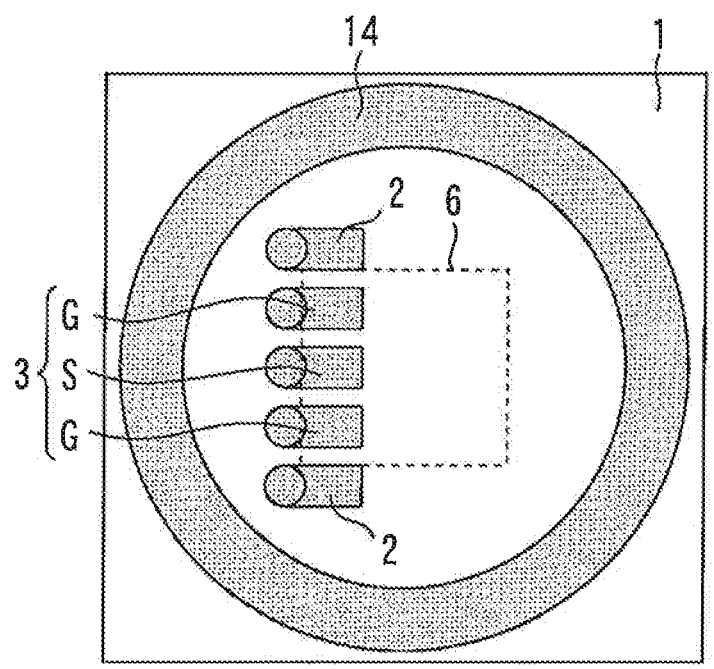
Figure 7:
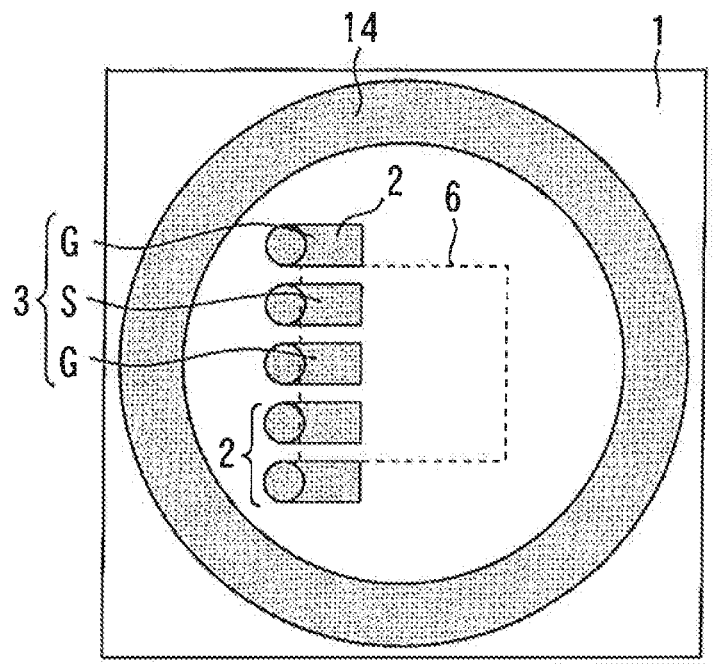
Figure 8:
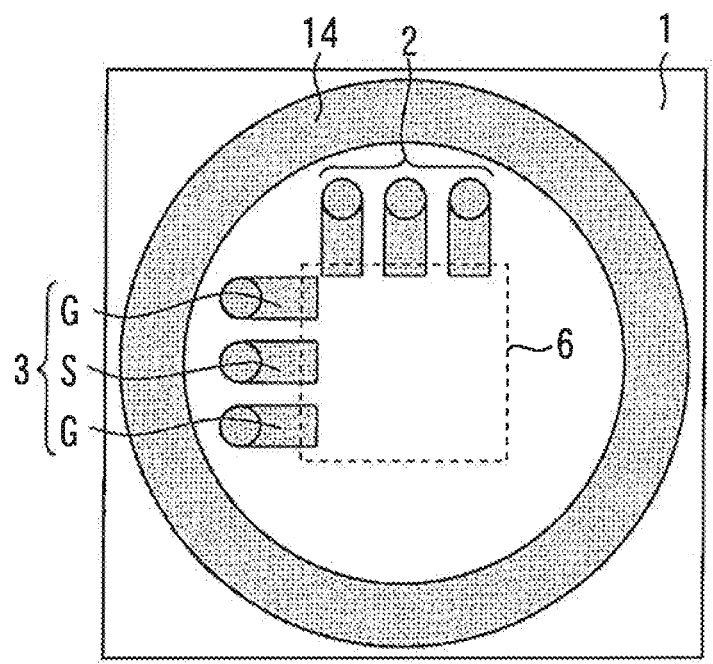
Figure 9:
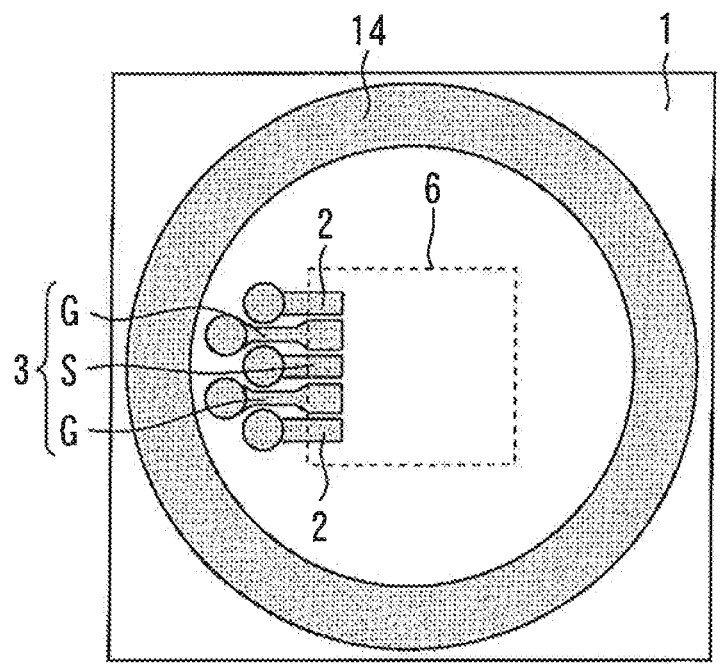
Figure 10:
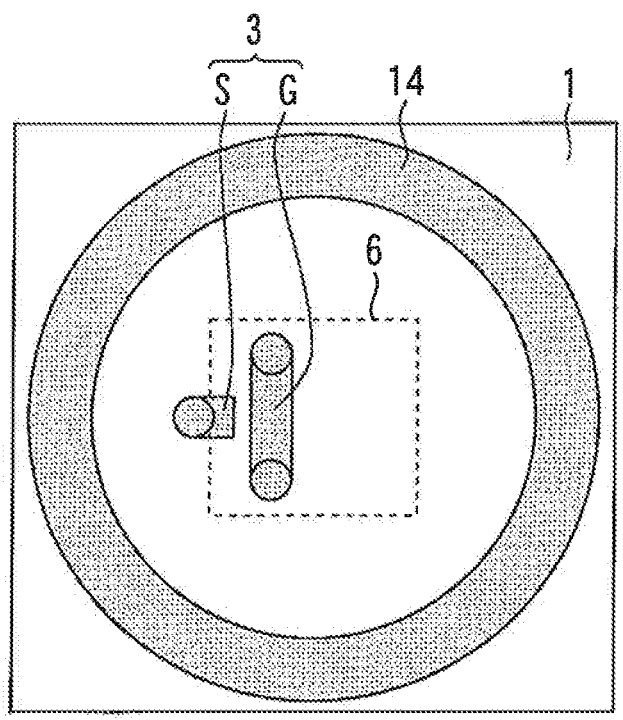
Figure 11:
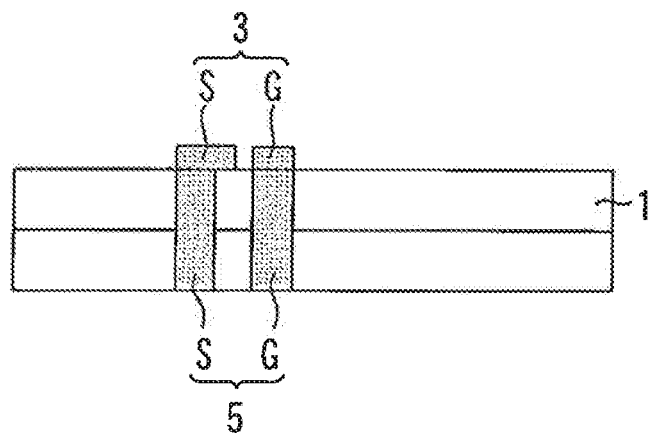
FIG. 11 is a sectional view of the multilayer ceramic substrate shown in FIG. 10.

FIGS. 5 to 10 are top views showing examples of the multilayer ceramic substrate according to Embodiment 1 of the present invention. FIG. 11 is a sectional view of the multilayer ceramic substrate shown in FIG. 10. In the cases shown in FIGS. 5 to 9, the wiring 3 is a coplanar line having signal wiring S interposed between pieces of ground wiring G. In the case shown in FIGS. 10 and 11, the wiring 3 is a microstrip line. The wiring 2 is a DC line or the like. Referring to FIG. 5, the wiring 2 and the wiring 3 are disposed opposite from each other. Referring to FIGS. 6 and 7, the wiring 2 and the wiring 3 are disposed in a row. Referring to FIG. 8, the wiring 2 and the wiring 3 are disposed in rows perpendicular to each other. Referring to FIG. 9, the wiring 2 and the wiring 3 are disposed in a staggered fashion. Since the wiring 3 on the multilayer ceramic substrate 1 is a coplanar line or a microstrip line as described above, a high-speed transmission at a rate of 40 Gb, for example, can be realized.

In the present embodiment, a high-frequency characteristic can be improved by using the multilayer ceramic substrate 1. Component parts can be mounted on the ceramic block 6 from all directions. The metallic ring 14 on the multilayer ceramic substrate 1 and the metallic cap 16 can be electrically welded to each other in an instant. On the multilayer ceramic substrate 1 before welding of the metallic cap 16, the ceramic block 6 and electronic parts can be easily mounted because there are no obstacles such as side walls. Therefore, an improvement in producibility can be achieved.

Also, a plurality of electronic parts can be three-dimensionally mounted on the surfaces of the ceramic block 6 provided on the multilayer ceramic substrate 1. The degree of design freedom can therefore be improved. Only one electronic part may suffice, and at least one electronic part may be provided on a surface of the ceramic block 6. Also, the lengths of wiring between the electronic parts can be reduced. A further improvement in high-frequency characteristic can thereby be achieved. Furthermore, the mount space can be increased in comparison with the case where electronic parts are mounted on the upper surface of the multilayer ceramic substrate 1 without using the ceramic block 6. A larger number of electronic parts can therefore be mounted inside the metallic cap 16.

Even in a case where an adhesive such as an epoxy resin is used when the ceramic block 6 is mounted on the multilayer ceramic substrate 1, a wiring bonding failure caused by resin bleed-out can be avoided if sufficiently large distances are secured between the electronic parts on the ceramic block 6 and the adhesive.

Figure 12:
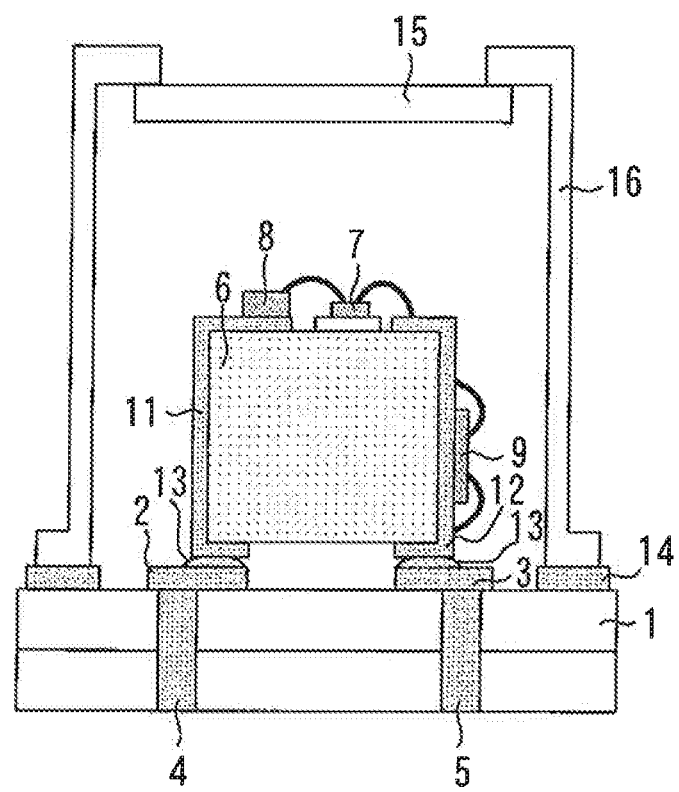
FIG. 12 is a sectional view showing a modified example of the semiconductor package according to Embodiment 1 of the present invention.

FIG. 12 is a sectional view showing a modified example of the semiconductor package according to Embodiment 1 of the present invention. The wirings 11 and 12 are formed by metalization on side surfaces of the ceramic block 6. Portions of the wirings 11 and 12 are turned and extended to a lower surface of the ceramic block 6. The ceramic block 6 is placed on the multilayer ceramic substrate 1 so that the portions of the wirings 2 and 3 are superposed on portions of the wirings 11 and 12. The portions of the wirings 2 and 3 and the portions of the wirings 11 and 12 are opposed and joined to each other by the electrically conductive joint material 13 provided therebetween. An improvement in high-frequency characteristic and an improvement in productivity are also achieved as in Embodiment 1 described above.

Embodiment 2

Figure 13:
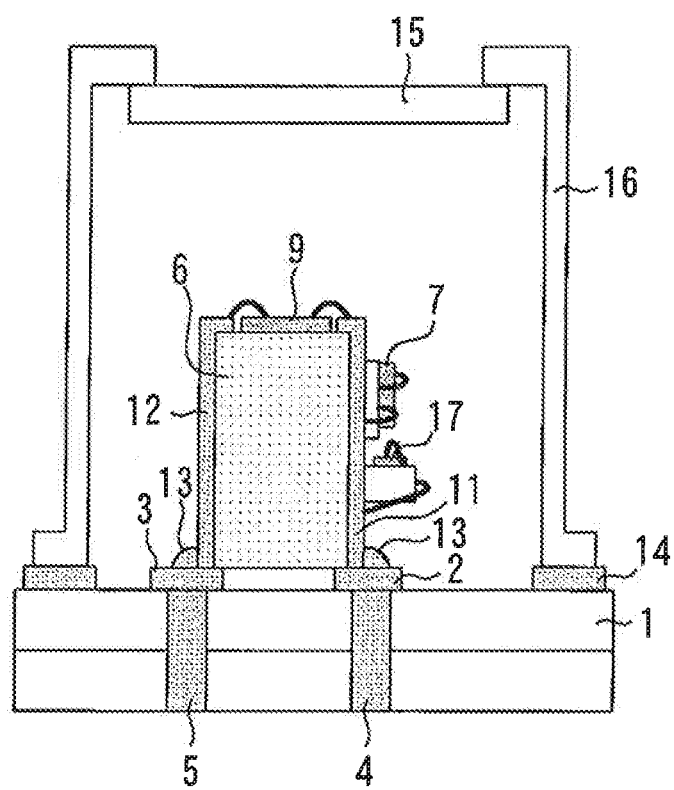
FIG. 13 is a sectional view showing a semiconductor package according to Embodiment 2 of the present invention.
Figure 14:
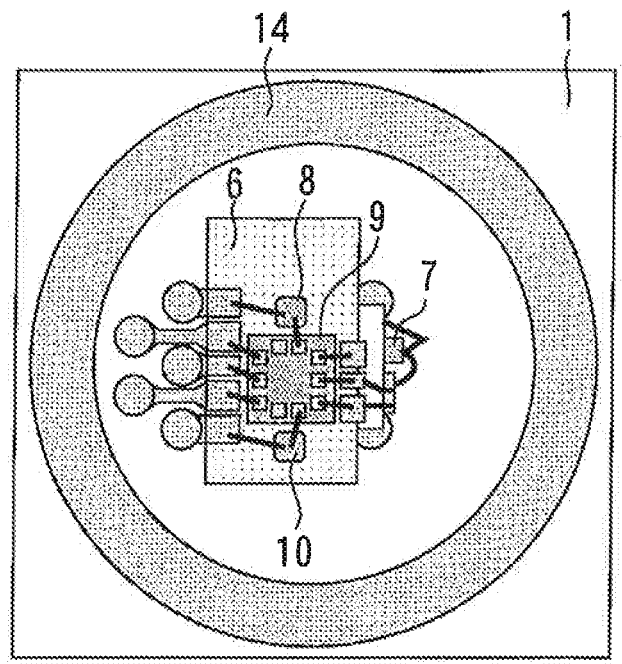
FIG. 14 is a top view showing parts inside a cap of the semiconductor package according to Embodiment 2 of the present invention.
Figure 15:
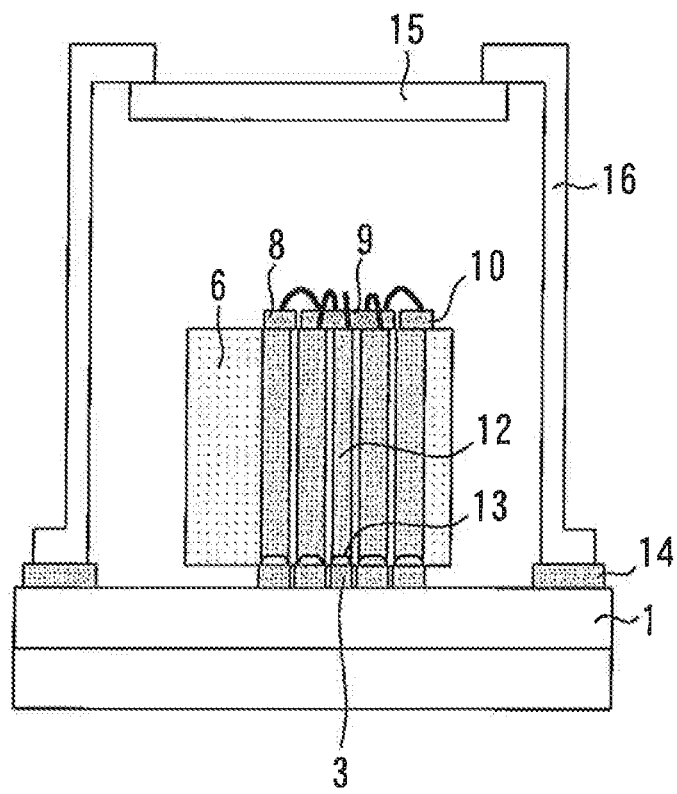
FIGS. 15 and 16 are sectional views showing the parts inside the cap of the semiconductor package according to Embodiment 2 of the present invention.
Figure 16:
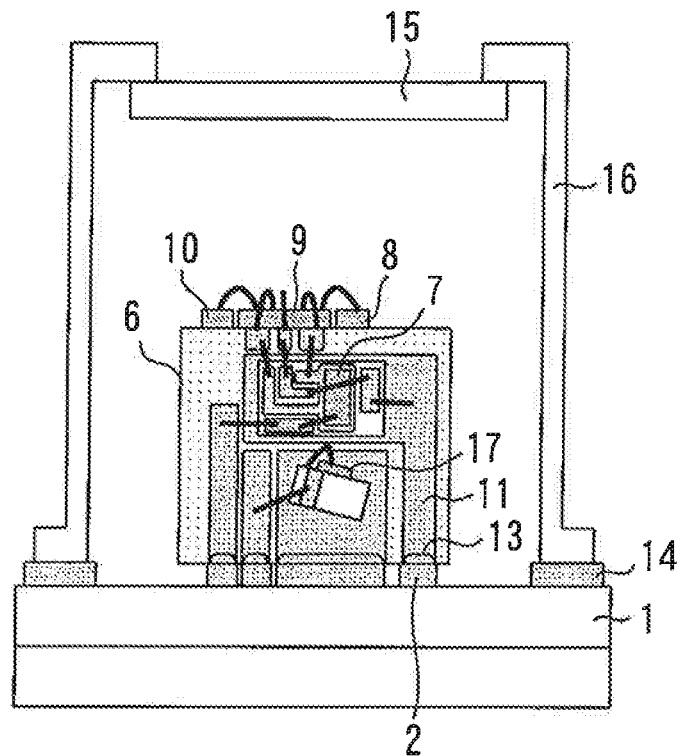

FIG. 13 is a sectional view showing a semiconductor package according to Embodiment 2 of the present invention. FIG. 14 is a top view showing parts inside a cap of the semiconductor package according to Embodiment 2 of the present invention. FIGS. 15 and 16 are sectional views showing the parts inside the cap of the semiconductor package according to Embodiment 2 of the present invention.

An end-surface-emitting type of semiconductor laser 7 and a photodiode 17 that receives light emitted from a rear end surface of the semiconductor laser 7 are provided on a side surface of a ceramic block 6. An end-surface-receiving type of light receiving element may be used in place of the end-surface-emitting type of semiconductor laser 7. Thus, not only a surface-light-receiving type but also end-surface-emitting type or end-surface-receiving type of optical semiconductor element can be used by being mounted on a side surface of the ceramic block 6.

Embodiment 3

Figure 17:
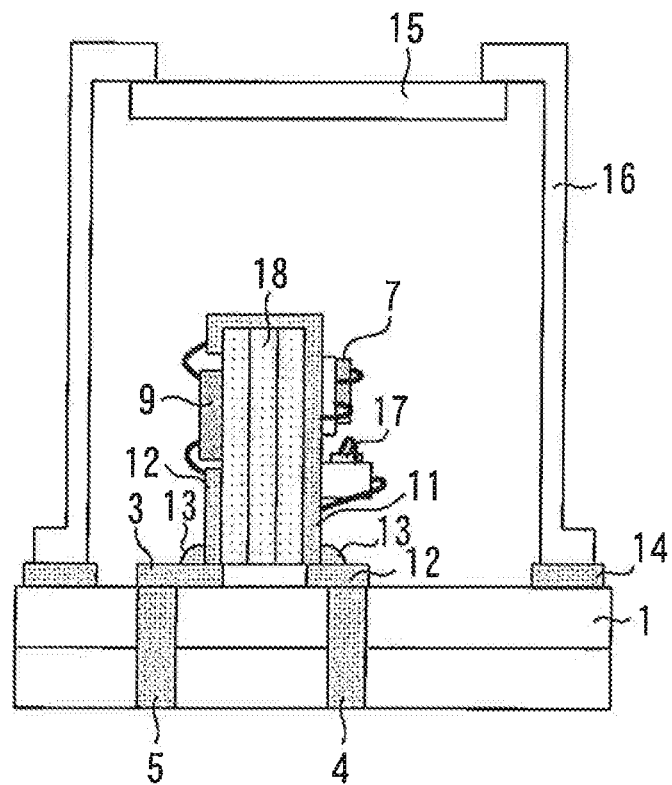
FIG. 17 is a sectional view showing a semiconductor package according to Embodiment 3 of the present invention.
Figure 18:
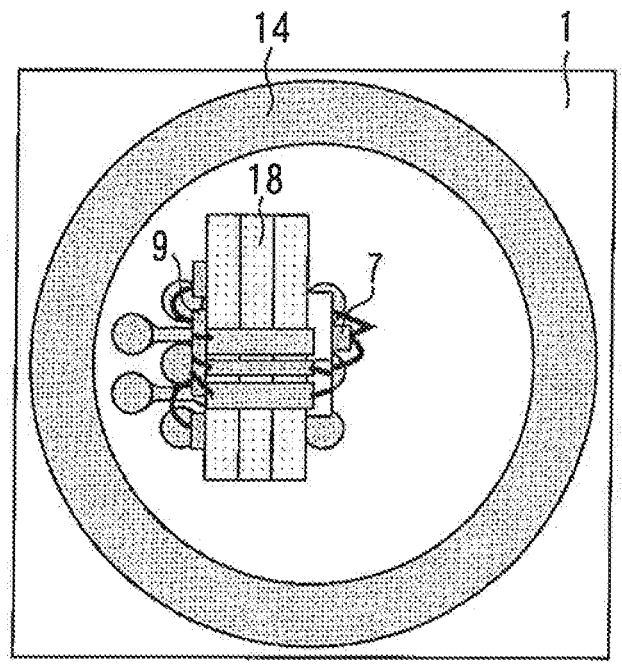
FIG. 18 is a top view showing parts inside a cap of the semiconductor package according to Embodiment 3 of the present invention.
Figure 19:
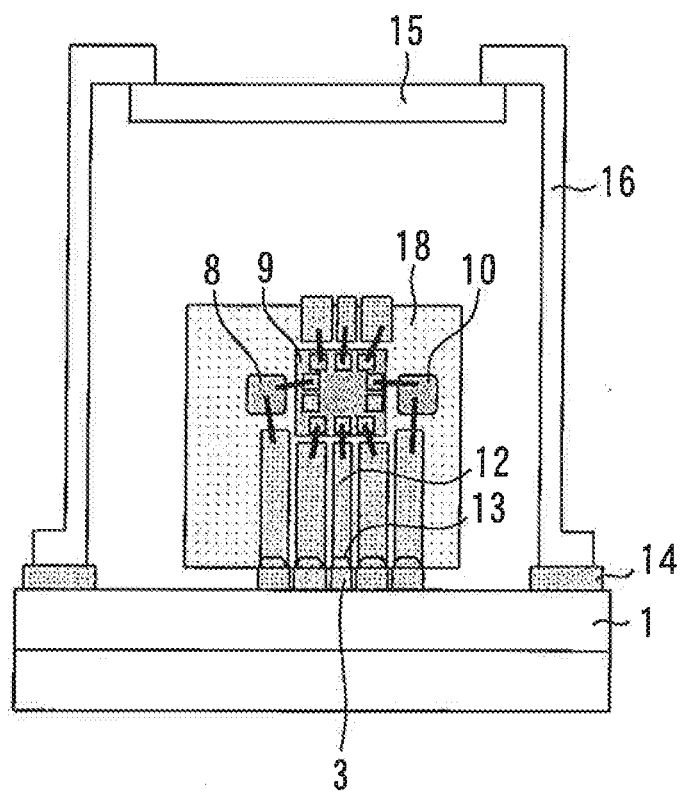
FIGS. 19 and 20 are sectional views showing the parts inside the cap of the semiconductor package according to Embodiment 3 of the present invention.
Figure 20:
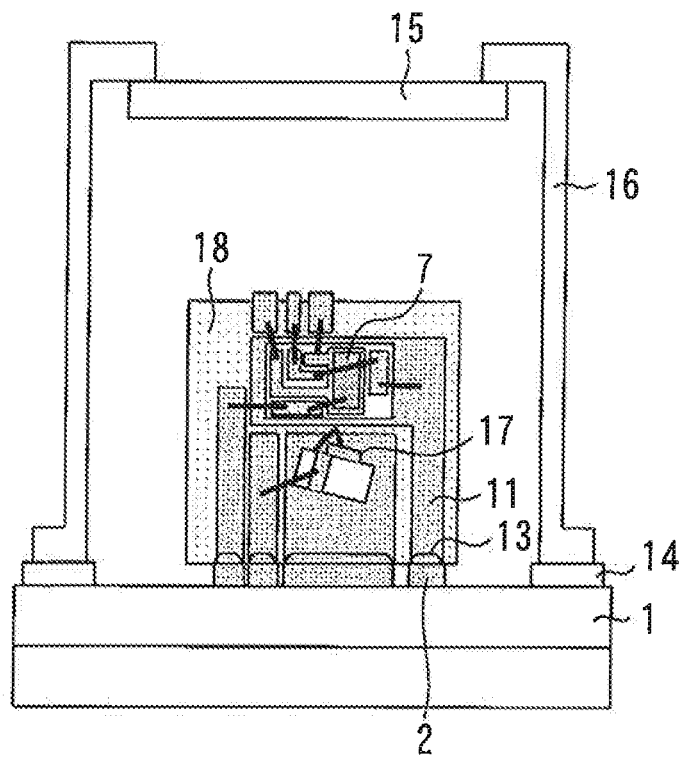

FIG. 17 is a sectional view showing a semiconductor package according to Embodiment 3 of the present invention. FIG. 18 is a top view showing parts inside a cap of the semiconductor package according to Embodiment 3 of the present invention. FIGS. 19 and 20 are sectional views showing the parts inside the cap of the semiconductor package according to Embodiment 3 of the present invention.

In the present embodiment, a multilayer ceramic block 18 is used. Wiring can be formed not only on surfaces but also in inner layers of the multilayer ceramic block 18. The layer stacking directions of the multilayer ceramic block 18 and a multilayer ceramic substrate 1 can be set different from each other by providing the multilayer ceramic block 18 and the multilayer ceramic substrate 1 as separate parts, thereby improving the degree of design freedom.

Embodiment 4

Figure 21:
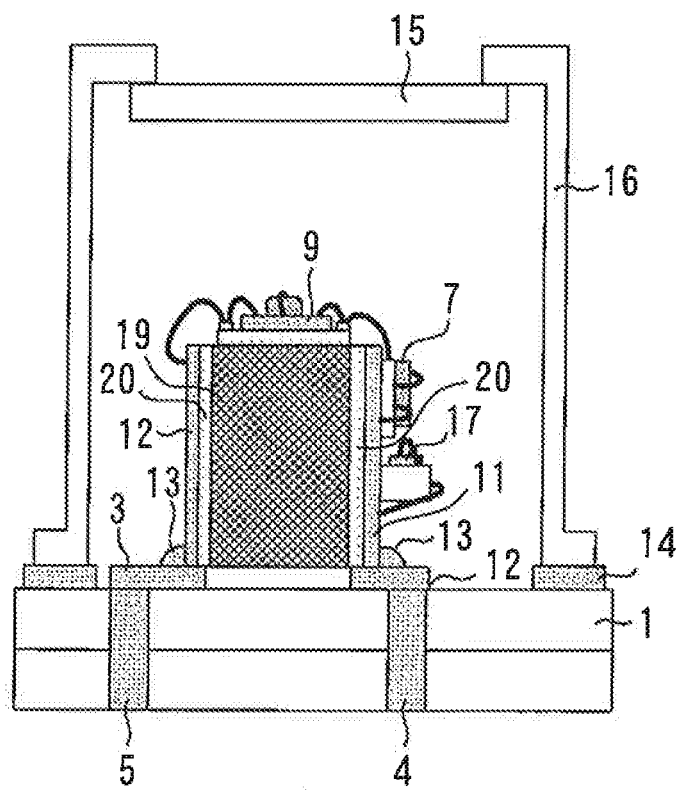
FIG. 21 is a sectional view showing a semiconductor package according to Embodiment 4 of the present invention.
Figure 22:
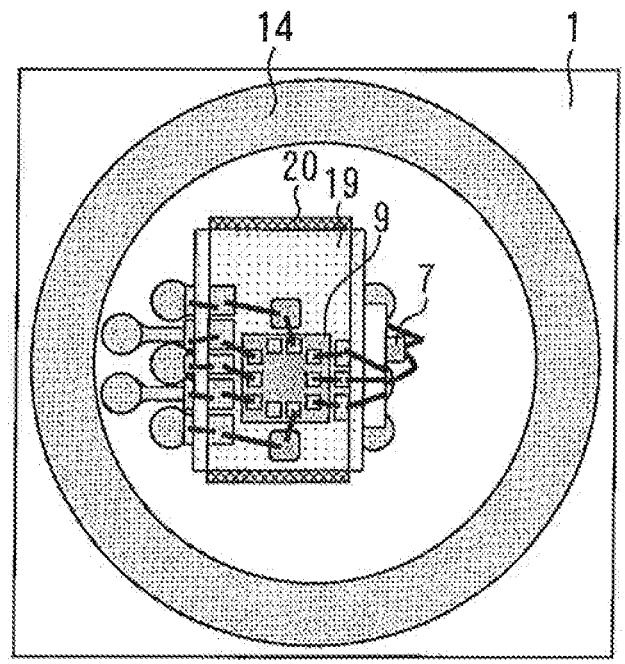
FIG. 22 is a top view showing a portion inside a cap of the semiconductor package according to Embodiment 4 of the present invention.
Figure 23:
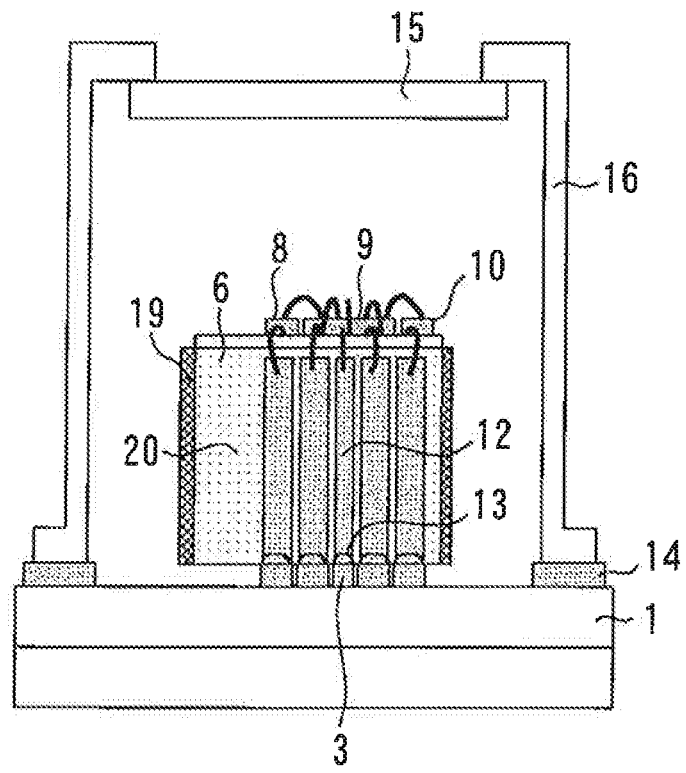
FIGS. 23 and 24 are sectional views showing the portion inside the cap of the semiconductor package according to Embodiment 4 of the present invention.
Figure 24:
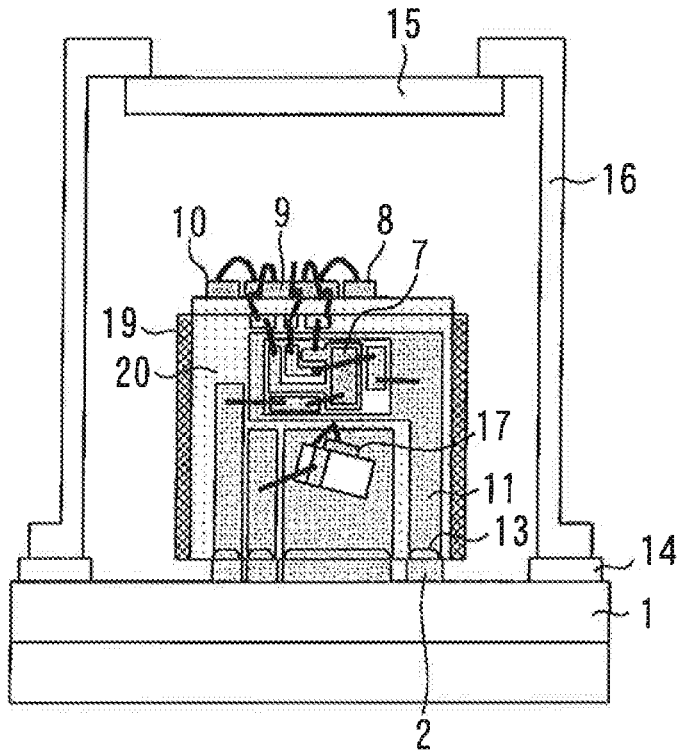

FIG. 21 is a sectional view showing a semiconductor package according to Embodiment 4 of the present invention. FIG. 22 is a top view showing a portion inside a cap of the semiconductor package according to Embodiment 4 of the present invention. FIGS. 23 and 24 are sectional views showing the portion inside the cap of the semiconductor package according to Embodiment 4 of the present invention.

In the present embodiment, a metal block 19 is used. The metal block 19 has high-heat releasability and is capable of efficiently cooling a semiconductor laser 7. The surfaces of the metal block 19 are partially covered with an insulating film 20. Wirings 11 and 12 are provided on the insulating film 20.

Embodiment 5

Figure 25:
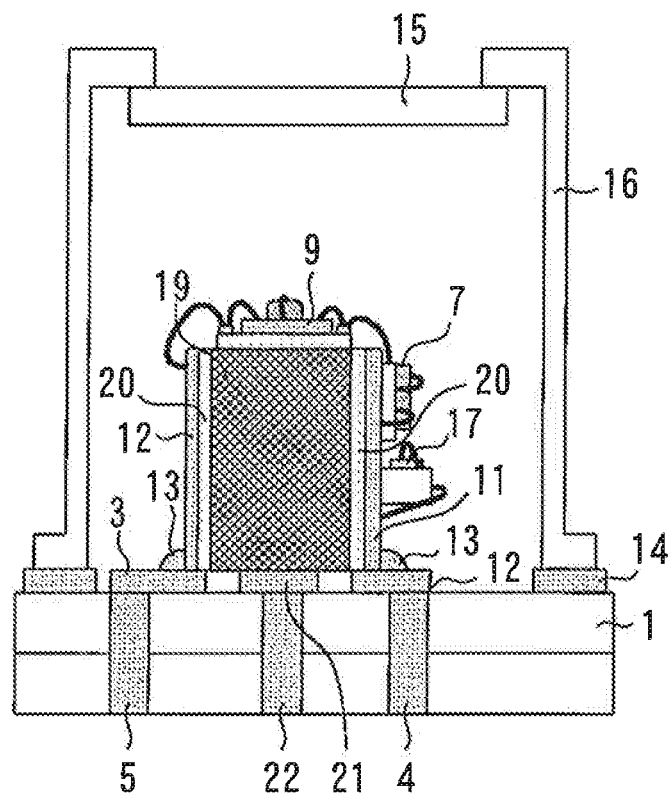
FIG. 25 is a sectional view showing a semiconductor package according to Embodiment 5 of the present invention.
Figure 26:
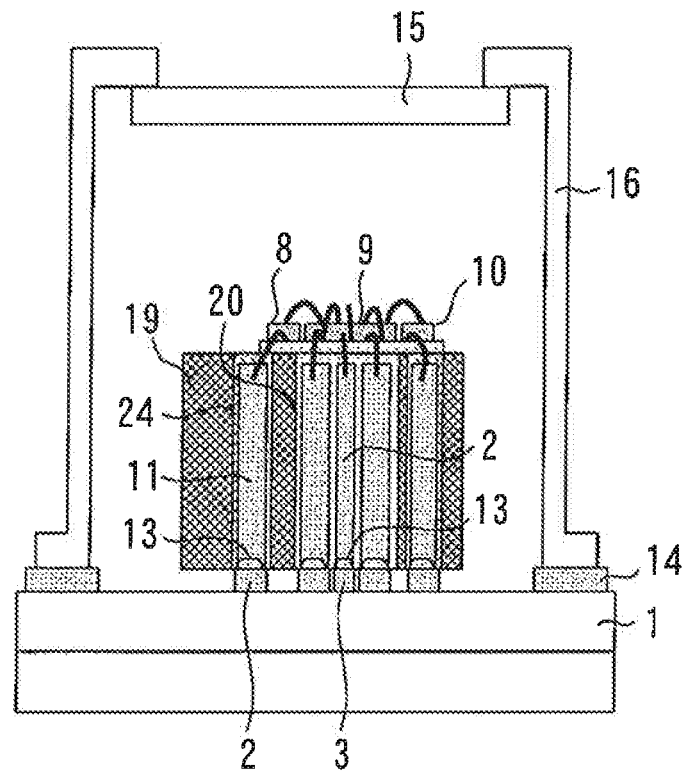
FIGS. 26 and 27 are side views showing parts inside a cap of the semiconductor package according to Embodiment 5 of the present invention.
Figure 27:
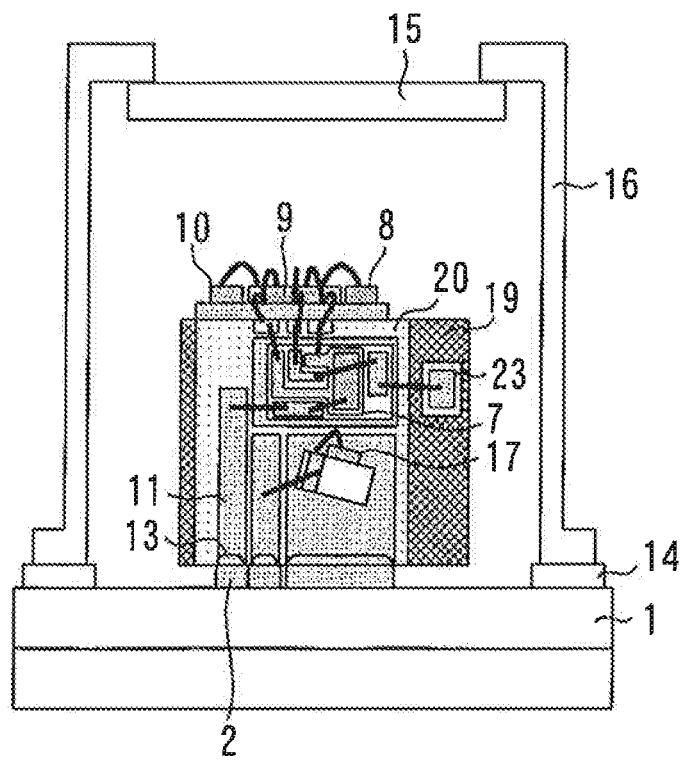

FIG. 25 is a sectional view showing a semiconductor package according to Embodiment 5 of the present invention. FIGS. 26 and 27 are side views showing parts inside a cap of the semiconductor package according to Embodiment 5 of the present invention.

A metal block 19 is connected to wiring 21 on a multilayer ceramic substrate 1. The wiring 21 is connected to a via 22 formed through the multilayer ceramic substrate 1. A capacitor 23 is connected to the metal block 19. The metal block 19 can thus be used as a transmission path or electrical earth.

The wiring 11 may be provided not only on the insulating film 20 but also on a surface of the metal block 19 with an insulating adhesive 24 such as a resin applied therebetween. The degree of freedom can thus be improved.

In Embodiments 1 to 5, the glass window 15 may be replaced with a lens in a case where the optical semiconductor element is the semiconductor laser 7. Light emitted from the semiconductor laser 7 diffuses with the distance from the semiconductor laser 7 but can be condensed by the lens. The optical coupling efficiency can therefore be improved.

DESCRIPTION OF SYMBOLS

1 multilayer ceramic substrate
2,3 wiring (first wiring)
7 semiconductor laser (optical semiconductor element, electronic part)
9 drive circuit (electronic part)
11,12 wiring (second wiring)
13 electrically conductive joint material
15 glass window (window)
16 metallic cap
17 photodiode (electronic part)
18 multilayer ceramic block (block)
19 metal block (block)
20 insulating film
21 wiring (third wiring)
23 capacitor (electronic part)
24 insulating adhesive

The invention claimed is:

1. A packaged optical semiconductor device comprising:
a multilayer ceramic substrate having opposed first and second surfaces and a thickness between the first and second surfaces, and including a first via penetrating through the thickness of the multilayer ceramic substrate and exposed at the first surface of the multilayer ceramic substrate;
a first wiring located on the first surface of the multilayer ceramic substrate and in electrical contact with the first via;
a block having opposed first and second end surfaces, and side surfaces extending between the first and second end surfaces of the block, wherein the block is mounted, relative to the multilayer ceramic substrate, with the second end surface of the block facing the first surface of the ceramic multilayer substrate;
a plurality of electronic parts mounted on at least one of the first end surface and the side surfaces of the block, wherein the plurality of electronic parts includes an optical semiconductor element;
a second wiring located on at least one of the side surfaces, of the block and connecting at least one of the electronic parts, of the plurality of electronic parts, to the first wiring; and
a metallic cap with a window, mounted on the first surface of the multilayer ceramic substrate, and completely enclosing the block, the first and second wirings, and the plurality of electronic parts within a volume defined by and between the metallic cap and the first surface of the multilayer ceramic substrate, wherein the first wiring is joined to and electrically connected to the second wiring within the volume, thereby mounting the block relative to the multilayer ceramic substrate.

2. The packaged optical semiconductor device according to claim 1, wherein
the second wiring extends onto the second end surface of the block, and
a part of the first wiring overlaps a part of the second wiring, and further comprising an electrically conductive joint material, bonding and electrically connecting the part of the first wiring and the part of the second wiring that overlap to each other.

3. The packaged optical semiconductor device according to claim 1, wherein the optical semiconductor element is an end-surface light emitter or an end-surface light detector and is located on one of the side surfaces of the block.

4. The packaged optical semiconductor device according to claim 1, wherein the block is a multilayer ceramic block.

5. The packaged optical semiconductor device according to claim 1, including
a second via penetrating through the thickness of the multilayer ceramic substrate and exposed at the first surface of multilayer ceramic substrate, and a third wiring located on the first surface of the multilayer ceramic substrate and in electrical contact with the second via, wherein the block is a metal block, the metal block is electrically connected to the third wiring, and at least one of the electronic parts, of the plurality of electronic parts, is electrically connected to the metal block.

6. The packaged optical semiconductor device according to claim 5, further comprising an insulating film on at least one of the side surfaces of the metal block, wherein the second wiring is located on the insulating film.

7. The packaged optical semiconductor device according to claim 5, further comprising an electrically insulating adhesive bonding the second wiring to at least one of the side surfaces of the metal block.

8. The packaged optical semiconductor device according to claim 1, wherein the optical semiconductor element is a semiconductor laser, and the plurality of electronic parts includes at least one of a drive circuit for driving the semiconductor laser and a photodiode that detects light emitted from a rear end surface of the semiconductor laser.

9. The packaged optical semiconductor device according to claim 1, wherein the second wiring is a coplanar line.

10. The packaged optical semiconductor device according to claim 1, wherein the second wiring is a microstrip line.

\* \* \* \* \*